US005627081A

United States Patent [19]
Tsuo et al.

[11] Patent Number: 5,627,081
[45] Date of Patent: May 6, 1997

[54] METHOD FOR PROCESSING SILICON SOLAR CELLS

[75] Inventors: Y. Simon Tsuo, Golden; Marc D. Landry, Lafayette; John R. Pitts, Lakewood, all of Colo.

[73] Assignee: Midwest Research Institute, Kansas City, Mo.

[21] Appl. No.: 346,010

[22] Filed: Nov. 29, 1994

[51] Int. Cl.$^6$ ........................ H01L 31/18; H01L 21/306
[52] U.S. Cl. ..................... 438/57; 136/258; 136/261; 216/66; 438/473; 438/795; 438/548; 438/960
[58] Field of Search ...................... 437/2, 4, 10–11, 437/16, 134, 143, 152, 160, 173–174, 233, 247, 929, 942, 967; 216/66; 156/635.1, 646.1, 662.1; 136/258 PC, 261

[56] References Cited

U.S. PATENT DOCUMENTS

| | | | |
|---|---|---|---|
| 5,225,355 | 7/1993 | Sugino et al. | 437/10 |
| 5,346,729 | 9/1994 | Pitts et al. | 427/582 |
| 5,426,061 | 6/1995 | Sopori | 437/11 |

FOREIGN PATENT DOCUMENTS

| | | | |
|---|---|---|---|
| 0021087 | 1/1981 | European Pat. Off. | 136/261 |
| 61-276325 | 12/1986 | Japan | 437/942 |

OTHER PUBLICATIONS

John R. Troxell et al., "Laser–Recrystallized Silicon Thin–Film Transistors on Expansion–Matched 800° C Glass," IEEE Electron Device Letters vol. EDL–8, No. 12, Dec. 1987, p. 576.

Martin J. Powell, "The Physics of Amorphous–Silicon Thin–Film Transistors," IEEE Transactions on Electron Devices, vol. 36, No. 12, Dec. 1989, pp. 2753–2763.

K. Sera et al. "High-Performance TFT's Fabricated by XeCl Excimer Laser Annealing of Hydrogenated Amorphous–Silicon Film," IEEE Transactions on Electron Devices, vol. 36, No. 12, Dec. 1989, pp. 2868–2872.

B. Hartiti et al.. "Towards High–Efficiency Silicon Solar Cells by Rapid Thermal Processing," Progress in Photovoltaic: Research Applications, vol. 2, pp. 129–142 (1994).

Werner Luft and Y. Simon Tsuo, "Hydrogenated Amorphous Silicon Alloy Deposition Processes," Applied Physics, *Microcrystalline Silicon and Silicon Carbide*, Chapt. 15, pp. 216–237 (1991).

Y.S. Tsuo et al., "Solar Cell Structures Combining Amorphous, Microcrystalline, and Single–Crystalline Silicon," 1993 IEEE Conference,. pp. 281–286.

J. Meier et al., "Complete Microcrystalline P–I–N Solar Cell—Crystalline or Amorphous Cell Behaviors"? Appl. Phys. Lett. 65(7), 15 Aug. 1994, 860–862.

K. Nakazawa et al., "Effect of Substrate Temperatures on Recrystallization of Plasma Chemical Vapor Deposition Amorphous Silicon Films," J. Appl. Phys. 68(3), 1 Aug. 1990, 1029–1032.

T. Matsuyama et. al., "Polycrystalline Si Thin–Film Solar Cell Prepared by Solid Phase Crystallization SPC) Method," Solar Energy Materials and Solar Cells 34 (1994) pp. 285–289.

(List continued on next page.)

*Primary Examiner*—Aaron Weisstuch
*Attorney, Agent, or Firm*—Edna M. O'Connor; Ruth Eure

[57] ABSTRACT

The instant invention teaches a novel method for fabricating silicon solar cells utilizing concentrated solar radiation. The solar radiation is concentrated by use of a solar furnace which is used to form a front surface junction and back-surface field in one processing step. The present invention also provides a method of making multicrystallline silicon from amorphous silicon. The invention also teaches a method of texturing the surface of a wafer by forming a porous silicon layer on the surface of a silicon substrate and a method of gettering impurities. Also contemplated by the invention are methods of surface passivation, forming novel solar cell structures, and hydrogen passivation.

19 Claims, 2 Drawing Sheets

OTHER PUBLICATIONS

R.Z. Bachrach et al., "Low Temperature Crystallization of Amorphous Silicon Using an Excimer Laser," Journal of Electronic Materials, vol. 19, No. 3, 1990, pp. 241–248.

R. Shimokawa et al., "Sub–5 μm Thin Film c–Si Solar Cell and Optical Confinement by Diffuse reflective–Substrate," Solar Energy Materials and Solar Cells 34 (1994) pp. 277–283.

J.S. Im et al. "Ion Irradiating Enhanced Crystal Nucleation in Amorphous Si Thin Films," Appl. Phys. Lett, 57(17) 22 Oct. 1990, pp. 1766–1768.

S. Arimoto et al., "High–efficient Operation of Large–area (100 cm$^2$) Thin Film Polycrystilline Silicon Solar Cell Based on SOI Structure," Solar Energy Material and Solar Cells 34 (1994) pp. 257–262.

R. Hollingsworth et al., "Deposition of Polycrystalline Silicon Thin Films by Plasma Enhanced CVD," Met. Res. Soc. Synp. Proc. vol. 263, 1993, pp. 659–664.

"Deposition of Diamond–Like Carbon Films and Other Materials Processes Using a Solar Furnace," Technological Advances, Mat. Tech. 1993 8:pp. 237–249.

A. Rohatgi et al., "Investigation of the Effect of Aluminum Treatment on Silicon Solar Cells," 0–7803–1220, 1993 IEEE, pp. 52–57.

Y. Simon Tsuo et al., "Recent Results on Hydrogen Passivation of Silicon Sheet Solar Cells," J. Appl. Phys. 57(12), 15 Jun. 1985, pp. 5523–5524.

K. Okamoto et al, *Conference Record, 16th IEEE Photovoltaic Specialists Conf.* (1982), pp. 818–823.

METHOD FOR PROCESSING SILICON SOLAR CELLS

CONTRACTUAL ORIGIN OF THE INVENTION

The United States Government has rights in this invention under Contract No. DE-AC36-83CH10093 between the United States Department of Energy and the National Renewable Energy Laboratory, a Division of Midwest Research Institute.

BACKGROUND OF THE INVENTION

Silicon is unique in photovoltaic materials in that it is an elemental semiconductor with no stoichiometry and interdiffusion problems. Crystalline silicon solar cells have high efficiency and excellent stability. Currently, about 72% of the world's photovoltaic module shipments consist of single or polycrystalline silicon solar cells. Crystalline silicon can tolerate high-temperature device processing steps, and, indeed, requires many high-temperature steps for high-efficiency solar cell manufacturing. These high-temperature steps have been the dominant factor for the high cost of silicon solar cell manufacturing.

The present invention uses concentrated sunlight instead of electricity, as the energy source for the high-temperature steps needed to manufacture silicon solar cells. When concentrated sunlight strikes a surface, such as a silicon wafer, the surface is rapidly heated to accomplish a variety of thermal processing steps, and can be cooled in an easily controlled manner.

Sunlight is concentrated using a high flux solar furnace. Generally, a high flux solar furnace is comprised of a heliostat to track the movement of the sun, a concentrator, and a target point. The concentrator can be one or more mirrors, or, one or more refractive lenses, aligned so as to direct the incident sunlight at a predetermined focal point. This focal point is selected to maximize the concentration of incident light, or achieve a desired flux profile. The target point coincides with this focal point, and a platform or chamber is placed at this focal point to support the material to be processed.

Most electricity is currently generated by converting conventional sources, such as fossil fuels and nuclear power, to heat, and then from heat to electricity. This electricity is then converted back into heat for high-temperature processing of solar cells. This inefficient method results in considerable transmission and generation losses, and excessive pollution. The concentrated sunlight of the present invention is provided by a solar furnace, which produces high temperatures directly from the radiant energy of concentrated sunlight. In addition, the heating rate is extremely high, with the concentrated sunlight often being able to heat thin layers of the surface being treated to the desired processing temperature in fractions of a second, while leaving the bulk unaffected. Also, because a solar furnace can deliver photons from the entire solar spectrum, preferred portions of the spectrum can be selected by using the proper filters. Also, a solar furnace relies on an abundant and clean supply of energy.

The prior art teaches silicon solar cell processing by using heating lamps, such as tungsten-halogen quartz lamps that are rich in infrared, and lasers, such as excimer lasers that are rich in ultraviolet. Flash lamp heating has already been used in commercially available products for firing screen printed contacts for silicon (Si) solar cells and for soldering metal ribbons for interconnecting cells to form modules.

An important difference between using a high flux solar furnace and artificial light sources is that the solar furnace offers a slow and easily controllable cool-down rate. Rapid thermal processing (RTP), as disclosed by Hartiti, B. et al (*Progress in Photovoltaics, Research and Applications*, Vol. 2, pp. 129–142, 1994), states that "Rapid thermal processing has only little success for devices like power diodes, nuclear detectors, and solar cells because the problem for these kinds of devices is the preservation of high bulk lifetimes. This last point has been the major source of drawbacks of early solar cells (fabricated) using rapid thermal processing . . . The origin of this degradation is related to transition metals or metallic complexes involving carbon, oxygen and the dopant which are not deactivated during the quenching step inherently associated to the fast cooling (of the rapid thermal processing process)." While fast cooling is inherent to rapid thermal processing using artificial sources, it is not inherent to a high-flux solar furnace. Slow, controllable cooling, as is achieved using a high flux solar furnace, is believed to contribute to the improved performance of high flux solar furnace-processed cells over conventional cells. In addition, it is very easy to control the cooling rate in a high flux solar furnace. Rapid thermal processing for solar cells has been studied for at least over ten years, and has not been adopted in a large scale by the solar cell industry.

Another advantage of using concentrated sunlight is the very broad (wide) wavelength spectrum of the high flux solar furnace compared to most artificial sources. Many of the artificial light sources used for solar cell processing are "single-wavelength" lasers. A broad wavelength spectrum provides more uniform heating through the thickness of the solar cell. This uniform heating is important for solar cells because, unlike integrated circuits which are planar devices, solar cells need to have electric charge transported through the entire thickness of the cell. A planar device like an integrated circuit uses only the top surface region of the device.

Artificial light sources, such as arc lamps, can produce broad spectra, but usually have very short electrode life and are not spatially uniform enough for large area solar cell processing. Solar cells are "large-area" devices. i.e. typically 10 cm×10 cm in area, or larger. Some commercial solar cells are as large as 1.2 m×1.2 m (4 ft×4 ft). It is not easy to make high-intensity artificial light sources having even distribution over such large areas. A major advantage of using a solar furnace over arc lamps is that the long focal length of the solar furnace permits substantial flexibility in the geometry of the set up which is not possible with the characteristically short focal length of an arc lamp.

Another advantage of the process of the present invention is that it is a cold-wall process; i.e., only the sample under treatment is heated, not the reactor walls. This greatly reduces the possibility of impurity contamination from the chamber walls. Impurity contamination from the chamber walls has been a major factor in reducing the carrier lifetime of silicon in conventional high-temperature processes. This in turn reduces the performance of the solar cells manufactured. Periodic, sometimes daily, cleaning of the high-temperature furnace using hydrofluoric acid-containing solutions is required. This increases the cost of manufacturing solar cells and also generates large quantifies of toxic waste. In conventional hot-wall furnace processing, the need to heat up the entire furnace is a tremendous waste of energy, and also limits the throughput because it is a time consuming process to heat up and cool down high-temperature furnaces. In contrast, high flux solar furnace processing rapidly and efficiently heats only the sample directly with concentrated sunlight. And, because the reactor walls remain cool, the chances of sample contamination from impurities emanating from the reactor walls are greatly reduced. This method of manufacturing high-efficiency solar cells also reduces the cost of manufacturing because less frequent cleaning of the reactor is needed.

In summary, the high-intensity, large-area light flux and the high degree of control over the flux profile that can be achieved using a high flux solar furnace cannot be readily achieved using any single or combination of artificial light sources currently available. Because of its simplicity, the high flux solar furnace can easily be modified for a variety of manufacturing applications.

Another silicon solar cell process which is recently gaining importance and which can be effectively accomplished using the high flux solar furnace is the crystallization of amorphous silicon thin films into multicrystalline silicon. Multicrystalline silicon is defined herein as being non-amorphous silicon.

Multicrystalline silicon thin films (mc-Si) are usually deposited on a substrate by a chemical vapor deposition (CVD), a physical vapor deposition (PVD), or a liquid-phase epitaxy (LPE) technique. Si films deposited by physical vapor deposition or chemical vapor deposition on a low-cost, nonepitaxial substrate usually have an average grain size of less than 1 micron. Microcrystalline (μc-Si) silicon is defined herein as having an average grain size on the order of 1 micron, or less. Microcrystalline silicon films deposited using plasma-enhanced chemical vapor deposition with strong hydrogen dilution of the Si-containing feedgas and high radio-frequency (RF) power densities are widely used as heavily doped window contact layers and tunnel-junction contact layers in hydrogen containing amorphous silicon (a-Si:H) solar cells. (Luft, W. and Tsuo, Y. S. 1993, Ch. 15, *Hydrogenated Amorphous Silicon Alloy Deposition Processes*, Marcel Dekker, Inc., New York, 1993 and Tsuo et al., "Solar Cell Structures Combining Amorphous, Microcrystalline, and Single-Crystalline Silicon," Proc. 23rd IEEE Photovoltaic Specialists Conf., pp. 281–186, 1993). However, larger Si grain sizes are needed for use as active semiconductor layers in such applications as thin film transistors for controlling active-matrix liquid-crystal picture elements (pixels) of large-area flat-panel displays. (See, for example, Powell, M. J., IEEE Transactions on Electron Devices Vol. 36, p. 2753, 1989, and Kanicki. J., Editor, "*Amorphous & Microcrystalline Semiconductor Devices*, Vol. II: Materials and Device Physics", Artech House, Inc., Boston, 1992) and photovoltaic solar cells (Meier, J., Flückiger, R., Keppner, H. and Shah, A. "Complete microcrystalline p-i-n solar cell-crystalline or amorphous cell behavior?", Appl. Phys. Lett., Vol.65, pp. 860–862, 1994.) A post-deposition annealing of physical vapor deposition or chemical vapor deposition deposited amorphous silicon or multicrystalline silicon is usually needed to obtain large crystalline grain sizes. Plasma-enhanced chemical vapor deposition is usually used to deposit the initial amorphous silicon film because of its low temperature deposition and high purity. Relatively high deposition rates can be used because the initial electronic property of the amorphous silicon is not important, since the film will subsequently be crystallized.

Liquid-phase epitaxy silicon deposited on an epitaxial substrate usually has the high deposition rate and large grain size required for semiconductor device applications. However, the need for a substrate with large grain size and a lattice constant that closely matches that of the deposited silicon and the relatively high deposition temperature are disadvantages of liquid-phase epitaxy silicon growth. For liquid-phase epitaxy silicon films deposited on a low-cost, nonepitaxial substrate, a post-deposition annealing technique to enlarge the grain size is also needed. It is also important to note that many low-cost substrates, such as Corning 7059 glass, cannot stand processing temperatures above 600° C. Thus, a low-temperature, solid-phase crystallization (SPC) method is often preferred.

For conventional furnace annealing of plasma-enhanced chemical vapor deposition deposited a-Si:H, grain size as large as 4 μm and field effect mobility as high as 158 $cm^2/V \cdot s$ have been reported by Nakazawa, K. and Tanaka, K., *J. Appl. Phys.* Vol. 68, p. 1029, 1990. For comparison, the effective electron mobility in a-Si:H is only up to 1 $cm^2/V \cdot s$; in single-crystal Si, it is up to 1400 $cm^2/V \cdot s$. However, such annealing usually takes over ten hours or even days and cannot be used to selectively crystallize certain areas of an a-Si:H film. Sanyo Electric Company recently produced an 8.5%-efficient, 1-$cm^2$ solar cell using a 10-μm-thick, solid-phase crystallization multicrystalline silicon with the structure of indium tin oxide (ITO)/p-type a-Si:H/intrinsic a-Si:H/n-type μc-Si/metal. The solid-phase crystallization poly-Si deposited on a textured substrate has a maximum mobility of 623 $cm^2/V \cdot s$ at a carrier concentration of $3.10 \times 10^{15}$ $cm^{-3}$. The solid-phase crystallization was done in a conventional furnace at 600° C. for 10 hours. (Matsuyama, T., Baba, T., Takahama, T., Tsuda, S., and Nakano, S., "Polycrystalline Si thin-film solar cell prepared by solid phase crystallization method", *Solar Energy Materials and Solar Cells*, Vol. 34, pp.285–289, 1994). This 8.5% conversion efficiency is higher than the stabilized efficiency of most a-Si:H solar cells.

Melt recrystallization methods using a directed energy beam are interesting alternatives that have the added advantage of being able to selectively crystallize areas of the deposited film. Conventional rapid thermal processing with a continuous-wave laser requires high substrate temperature and is not very practical since high substrate temperature can cause substrate damage and semiconductor film contamination. Rapid thermal processing also has high energy requirements. (Troxell, J. R., Harrington, M. I., and Miller, R. A., "*IEEE Electron Device*" Lett. Vol. EDL-8, p. 576, 1987).

More recent investigations involving using a pulsed laser, such as an excimer laser have achieved considerable success. (Sera, K., Okumura, F., Uchida, H., Itoh, S., Kaneko, S., and Hotta, K., "IEEE Transactions on Electron Devices" Vol. 36. p. 2868, 1989: and Bachrach, R. Z., Winer, K., Boyce, J. B., Ready, S. E., Johnson, R. I, and Anderson. G. B., *J. Electronic Materials* Vol. 19, p. 241, 1990). For example, Sera et al. reported that the field effect mobility increased from 0.23 $cm^2/V \cdot s$ for a-Si:H to 102 $cm^2/V \cdot s$ for laser-crystallized μc-Si. Recently, solar cells with 6.5% conversion efficiency have been made using 4.2-μm-thick laser-melt-and-crystallization silicon with optical confinement by diffuse reflective substrate (Shimokawa. R., Ishii, K., Nishikawa, H., Takahashi, T., Hayashi, Y., Saito, I., Nagamine, F., and Igari, S., "Sub-5 μm Thin Film c-Si Solar Cell and Optical Confinement by Diffuse Reflective Substrate," *Solar Energy Materials and Solar Cells*, Vol. 34, pp. 277–283, 1994). Instead of a laser beam, an ion beam can also be used for crystallization. High-energy (1.5 MeV) $Xe^+$ ion irradiation has been shown to enhance the solid-phase crystallization of a-Si:H at low temperatures (500°–580° C.). (Im, J. S. and Atwater, H. A. *Appl. Phys. Lett.*, Vol 57, p. 1766, 1990).

Zone-melting recrystallization (ZMR) by scanning a carbon strip heater is also a popular method of crystallizing silicon. Recently, a 14.2% photovoltaic solar cell has been made using a 60-μm-thick active polycrystalline silicon layer with n-millimeter grain size. The polycrystalline silicon film was originally deposited on a $SiO_2$-coated single-crystalline silicon wafer by low-pressure chemical vapor deposition (Arimoto, S., Morikawa, H., Deguchi, M., Kawama, Y., Matsuno, Y., Ishihara, T., Kumabe, H., and Murotani, T., "High-efficient Operation of Large-area (100 $cm^2$) Thin Film Polycrystalline Silicon Solar Cell Based on SOI Structure," *Solar Energy Materials and Solar Cells*, Vol.34, pp.257–262, 1994).

SUMMARY AND OBJECTS OF THE INVENTION

One object of the present invention is to provide a novel method for the processing of silicon solar cells using sunlight which has a broadband visible spectrum that, in addition to heating the crystalline silicon, can excite charge carriers across the bandgap in photothermal processes.

Another object of the present invention is to provide a novel method for reducing the number of high-temperature steps needed for efficient solar cell fabrication.

Another object of the present invention is to use the high heating rate, controllable cooling rate, and the easily adjustable spatial distribution of light intensity of a high-flux solar furnace to manufacture novel solar cell structures.

Another object of the present invention is to provide a cold-wall process for the manufacture of silicon solar cells.

Another object of the present invention is to provide a process for solid phase crystallization of amorphous silicon thin films into multicrystalline silicon.

Another object of the present invention is to provide a method of gettering impurities to the surface of a wafer using a high flux solar furnace to anneal porous silicon etched metallurgical grade silicon.

Another object of the present invention is to provide a process of forming a textured layer on the surface of a substrate by exposing the substrate to concentrated solar radiation in the presence of a reactive gas.

In summary, high flux solar furnace processing improves the performance of crystalline silicon solar cells because (1) it provides a cold-wall process, which reduces contamination, (2) temperature vs. time profiles can be precisely controlled, (3) wavelength can be easily controlled, (4) intensity, and spatial distribution of the incident solar flux can be easily and rapidly controlled, (5) a number of high-temperature processing steps can be performed simultaneously, and (6) combined quantum and thermal effects may benefit the overall cell performance.

In addition, the use of high-flux solar furnace processing of crystalline silicon solar cells can provide a dramatic cost reduction for cell and module fabrication. The cost reduction comes not only from the low-cost power source (sunlight), it also comes from simpler manufacturing equipment, fewer processing steps, reduced wafer handling, and reduced pollution.

DETAILED DESCRIPTION OF THE INVENTION

Figure 1:
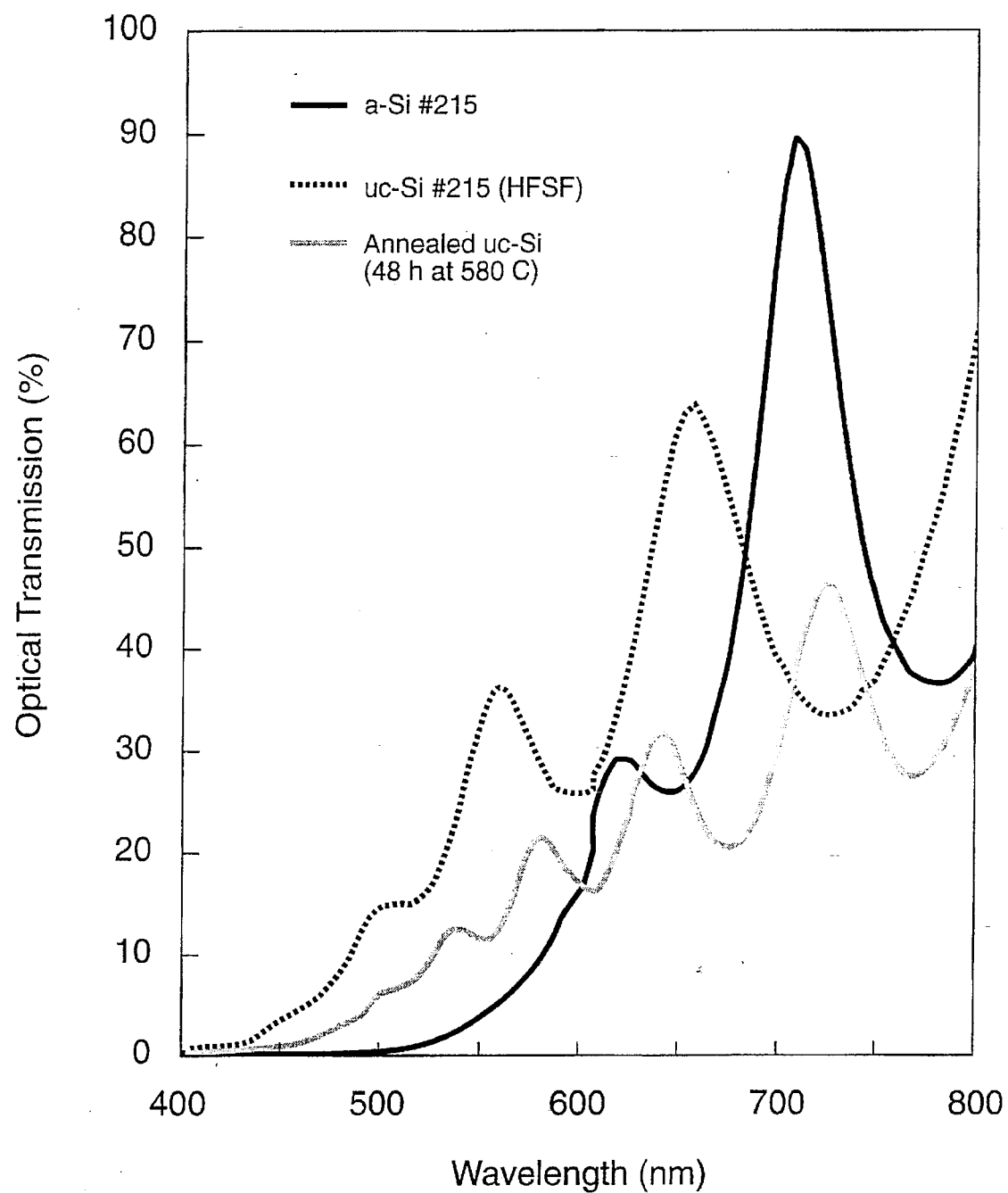
FIG. 1 shows a comparison of the transmission properties of (1) a film crystallized in accordance with the method of the present invention, (2) a film crystallized using a conventional quartz tube furnace and (3) an as-deposited film.

Experiments indicate that cells fabricated using the high-flux solar furnace require fewer processing steps and have higher efficiencies than cells processed using conventional quartz tube furnaces. In addition, unlike conventional gas-phase dopants, the spin-on liquid dopants used for the high-flux solar processing are non-toxic.

Fundamental properties of high-flux solar furnace processing that distinguish it from conventional cell processing methods include high heating rates, controllable cooling rates, cold-wall processing, photo-assisted dopant or etchant decomposition, filter-adjustable wavelength spectrum, and combinations of thermal and quantum effects.

High flux solar furnace processing can produce equal or higher efficiency cells than equivalent conventional processes. Furthermore, high flux solar furnace cell fabrication uses less energy and fewer processing steps than equivalent conventional methods.

Using High flux solar furnace to form front-surface junction and back-surface field in one processing step Because high flux solar furnace processing heats only the sample itself and does so rapidly, the possibility of either contaminating the sample from residual reactor contaminants, or contaminating the reactor itself with dopants or metals from the sample is greatly reduced. This makes it possible to combine several high-temperature processing steps and thus increase throughput and yield, reduce energy and capital equipment costs, and minimize high-temperature degradation of solar cells. For example, the front-surface $n^+$-p junction and the back-surface p-$p^+$ junction of a silicon solar cell can be formed in one high flux solar furnace heating step resulting in a significant improvement of the solar cell performance.

The substrate used in Example 1 of the present invention is a boron-doped silicon wafer. The boron doping yields a p-type semiconductor substrate.

The p-$p^+$ back surface field junction is needed in high-quality silicon cells in order to reduce the diffusion of minority carriers to the back surface. Otherwise, cell performance will be limited by charge carrier recombination at the back surface. In Example 1 of the present invention, a phosphorus-containing spin-on dopant for the $n^+$ region of the front junction and an Al—Si alloy (vacuum evaporated Al) for the $p^+$ region of the back surface field were used. The spin-on dopant applied to the front surface can be 0.1 to 1.0 micron thick.

The back surface dopant source layer can be deposited using a boron or aluminum containing spin-on or spray-on dopant from about 0.1 to about 1.0 micron thick. It has been discovered that a boron-doped back surface field is more effective than an aluminum-doped back surface field; probably because the solid solubility of boron in silicon is higher than that of aluminum. P-type dopants other than boron and aluminum can also be used.

Conventionally, junction formation is accomplished in a high-temperature quartz furnace.

EXAMPLE 1

Forming the front $n^+$-p junction and back-surface field at the same time using the high flux solar furnace A p-type, boron-doped silicon semiconductor was the starting substrate material used in this experiment. An aluminum film was evaporated onto the back surface of the substrate creating a p-type dopant source layer approximately 0.5 micron thick. Phosphorofilm type A spin-on dopant, purchased from Emulsitone Co., Whippany, N.J., was applied to the front surface of the wafer. Approximately 20 drops of the spin-on dopant were applied to the substrate wafer spinning at 2000 to 3000 rpm, creating a dopant layer approximately 0.5 micron thick. It is expected that dopant layer thicknesses ranging from about 0.1 to about 1.0 micron for both front and back layers are operable for carrying out the process of the present invention.

Four samples were prepared as set forth above and processing in the high flux solar furnace was performed on the samples using variable conditions. All four runs were performed in a 500-torr gas mixture of 2% oxygen and 98% nitrogen. The first sample, designated as SBR1-1, was processed for 15 minutes at a flux intensity of approximately 250 kW/m², which translates to a temperature of about 800° to about 850° C. The second sample, designated as SBR1-2, was processed for 15 min. at a flux intensity of approximately 230 kW/m², which translates to a temperature of around 800° C. The third sample, designated as SBR1-3, was processed for 2 minutes at a flux intensity of approximately 100 kW/m², which translates to a temperature of about 550°. Sample 4, designated as SBR1-4, was processed for 15 minutes at a flux intensity of about 180 kW/m², which translates to a temperature of about 870° C. These data are set forth in Table 1. It is expected that processing parameters designed to yield flux intensities of from about 150 kW/m² to about 500 kW/m² for approximately 3 to about 20 minutes will form effective junctions. These parameters are determined by the physical properties of the particular materials of the substrate and the dopant layers to be used.

TABLE 1

| Sample | Intensity kW/M² | Temperature °C. T | Time (Minutes) Ti |
|---|---|---|---|
| SBR 1-1 | 250 | 800–850 | 15 |
| SBR 1-2 | 230 | 800 | 15 |
| SBR 1-3 | 100 | 550 | 2 |
| SBR 1-4 | 280 | 870 | 15 |

The temperature used for the SBR1-3 run was too low and resulted in no junction formation. The other three runs all resulted in an $n^+$ layer on the front surface and an alloyed Al—Si layer on the back surface. Electrical properties including open circuit voltage, short circuit current and fill factor are set forth in Table 2. The sheet resistances of the $n^+$ layer of SBR1-1 and SBR1-4 are 15.8 ohm/square and 14.7 ohms/square, respectively.

SBR1-1,2, and 4 cells were then completed by depositing a transparent or translucent electrical conducting layer on the front surface of the cell. In these experiments, front Ti/Pd/Ag metal grids were formed by e-beam evaporation through a shadow mask followed by forming-gas annealing in a quartz tube furnace at 420° C. for 20 min. Back aluminum contacts were re-evaporated, since the previous aluminum layer was mostly consumed by alloying with silicon for back surface field. Mesa etching using photolithography and a 3-1-2 etchant to define the cell area was used for each cell. A 58.5-nm-thick indium-tin oxide layer was deposited on the top surface of the cells as an antireflection coating. The indium-tin-oxide film also enhanced the current collection at the front surface. All of the high flux solar furnace processed cells showed better photovoltaic conversion efficiency than cells produced by conventional methods.

TABLE 2

Characteristics of High Flux Solar Furnace Processed Cells

All cells are 1 cm² in area, which is defined by mesa etching, and are made on Wacker float-zone 0.2 Ω-cm p-type (100) single-crystal Si wafers with no surface texturing. All cells have a back-surface field created by alloying Al with Si and an evaporated Al back contact. The front Ti/Pd/Ag contact grids are vacuum evaporated through a shadow mask.

| Sample | Structure | $V_{OC}$ (V) Open Circuit Voltage | $J_{SC}$ (mA/cm²) Current Density | FF (%) Fill Factor | AM 1.5 η (%) Air Mass |
|---|---|---|---|---|---|
| SBR1-1 825° C., 15 min. | spin-on dopant, no SiO₂, no ARC | 0.606 | 22.0 | 70.3 | 9.36 |
| SBR1-1 ITO | SBR1-1 +685-Å ITO ARC | 0.613 | 28.3 | 75.2 | 13.1 |
| SBR1-2 800° C., 15 min. | spin-on dopant, no SiO₂, no ARC | 0.605 | 20.9 | 73.9 | 9.34 |
| SBR1-2 ITO | SBR1-2 +685-Å ITO ARC | 0.617 | 25.6 | 76.6 | 12.1 |
| SBR1-4 870° C., 15 min. | spin-on dopant, no SiO₂, no ARC | 0.609 | 20.0 | 74.7 | 9.11 |

| Sample | Structure | $V_{OC}$ (V) Open Circuit Voltage | $J_{SC}$ (mA/cm$^2$) Current Density | FF (%) Fill Factor | AM 1.5 η (%) Air Mass |
|---|---|---|---|---|---|
| Control conventional processing | one-step POCl$_3$, no SiO$_2$, no ARC | 0.570 | 20.1 | 67.1 | 7.68 |
| Control ITO | one-step POCl$_3$, no SiO$_2$, 685-Å ITO | 0.606 | 21.8 | 75.9 | 10.0 |

EXAMPLE 2

Solid phase Crystallization of Amorphous Silicon into Multicrystalline Silicon The high-flux solar furnace was used to convert hydrogen containing amorphous silicon into multicrystalline silicon thin films by the solid-phase crystallization process. Although this example utilized hydrogen-containing amorphous silicon, the process herein described will also be effective for converting microcrystalline silicon into multicrystalline silicon. Microcrystalline silicon is defined as having an average grain size of less than one micron. The hydrogen containing amorphous silicon films, provided by the Materials Research Group Inc., Wheat Ridge, Colo., were 400-nm-thick films glow discharge deposited on Corning 7059 glass substrates using a radio frequency of 110 MHz. A detailed description of this high-frequency deposition method has been presented in Hollingsworth, R. E. and Bhat, P. K., "Deposition of Polycrystalline Silicon Thin Films by Plasma Enhanced CVD", Mat. Res. Soc. Symp. Proc., Vol 283, pp.659–664, 1993.

The substrate so coated was exposed to concentrated solar radiation in the high-flux solar furnace at an intensity of about 1500 kW/m$^2$. It took less than five seconds to crystallize a one inch by one inch area of hydrogen containing amorphous silicon, whereas it typically takes over ten hours to achieve the same result by conventional furnace annealing. This fast crystallization was achievable because the high-flux solar furnace can heat the amorphous silicon film to very high temperatures while keeping the glass substrate at temperatures below 600° C. to avoid softening the glass during solid-state crystallization. A comparison of the transmission properties of a film crystallized using a high flux solar furnace at 1500 kW/m$^2$ for 5 seconds, a similar film crystallized using a conventional quartz tube furnace at 580° C. for 10 hours, and an as-deposited hydrogen containing amorphous silicon film is shown in FIG. 1. It is clear that the crystallization of the high flux solar furnace-annealed film is much more complete than the furnace-annealed film, even though the treatment time is nearly four orders of magnitude shorter. The substrate in this example was coated with a film having a thickness of 400 nm (0.4 micron), but it is expected that films with a thickness of from about 0.1 micron to about 20 microns will also effectively crystallize using the process of the present invention. It is also expected that flux intensities ranging from about 1000 to about 3000 kW/m$^2$ will effectively crystallize using this process. It is also expected that processing time may vary from about 1 second to about 30 seconds. The intensity and time required for processing will increase with the thickness of the film.

The advantages of the high flux solar furnace include low-cost, excellent large-area capability, uniformity over a large area, high throughput, and area-selectable crystallization. Table 3 shows a comparison of our high flux solar furnace crystallization method with other crystallization methods discussed earlier. (Luff, W., and Tsuo, Y. S., supra, p.235, Table 15.4-1)

TABLE 3

| mc-Si Crystallization Method | Large Area Capability | Uniformity | Throughput | Area Selectable |
|---|---|---|---|---|
| High Flux Solar Furnace | good | good | good | yes |
| As-Deposited | good | good | good | no |
| Furnace Anneal (SPC) | good | good | fair | no |
| Rapid Thermal Annealing (RTA) | poor | poor | fair | yes |
| Direct Energy Beam (laser, strip heater, e-beam & ion-beam) | poor | poor | fair | yes |

Using high heating and controllable cooling rates of High flux solar furnace to form novel solar cell structures The sample heating and cooling rate of high flux solar furnace processing can be controlled much more precisely and rapidly than conventional furnace processing and thus can result in sharper junctions or novel junction structures. Sharper junctions enhance the performance of solar cells by reducing light absorption in the heavily doped, and thus poor quality, region. Sharper junctions are also helpful in fabricating novel cell structures, such as multiple-junction solar cells.

Using the flexible spectrum, intensity, and spatial distribution of high flux solar furnace to manufacture novel solar cell structures The spectral distribution of concentrated starlight can be easily adjusted by using filters. The intensity of the concentrated sunlight can be rapidly adjusted through mirrors and shutter openings. The spatial distribution, or even three dimensional distribution, of the incident flux can be controlled and changed rapidly. These abilities are unique to high flux solar furnace processing and can open up many new processing possibilities. It is contemplated to adjust the spatial intensity distribution of the incident light to create different levels of doping (selective doping) on the sample surface. For example, it is well known that heavier doping under metal grids improves the solar cell efficiency. Instead of the conventional one-step diffusion of a single layer of the top surface doping region, many high-efficiency solar cell structures use a two-step diffused junction or selective emitter. Such emitters are heavily doped (about 20 ohms/square) in the contact regions and only lightly doped (80–100 ohms/square) in the active part of the cell.

Benefits of using the broad-band visible light spectrum of high flux solar furnace Artificial light sources used in some existing solar cell processing methods are either rich in ultraviolet or rich in infrared light. UV light is absorbed mostly near the sample surface. IR light does not have enough energy to excite charge carriers across the bandgap of silicon. The broad-band visible light of high flux solar furnace is absorbed more uniformly than UV light in the thickness of the sample and, in addition to heating the sample, also generates large numbers of electrons and holes in the bulk of the material. This process of combined quantum mechanical and thermal excitations is defined as a "photothermal process". (Pitts, R.; Tracy, E.; Stanley, J. and King, D. "Solar-Induced CVD of Diamond-Type Carbon Films", U.S. Pat. No. 5,346,729). This photothermal process has been shown to produce beneficial effects in diamond-like carbon film growth. This effect can also benefit silicon solar cell processing.

Surface Passivation Front surface passivation using a thin (2 nm or thicker) oxide is often included in high-efficiency cell design. The back surface charge carrier recombination at the metal-silicon interface is also high. A gridded or locally contacted (with selective contact openings) back electrode with oxide-passivated non-contact areas can reduce the back surface recombination velocity by reducing the back surface metal contact area and improve optical reflection. The front and back side oxidation can be easily accomplished in one step by using the high flux solar furnace.

Gettering Gettering is a method of reducing or eliminating impurities in a wafer by localizing the impurities in regions away from the active device regions. The gettering techniques are classified into two groups: extrinsic and intrinsic gettering. In extrinsic gettering, the gettering centers, which are usually defects that serve as impurity sinks, are introduced externally, usually at the backside of the wafer. In intrinsic gettering, the controlling defects are induced in the bulk of the wafer during thermal treatment processes. Internal gettering is not effective for solar cells because photogenerated charge carriers are required to travel the entire cell thickness to be collected. The most popular extrinsic gettering methods for Si solar cells are aluminum, phosphorus, and chlorine gettering. Al gettering is usually a backside gettering method done in combination with back electrode and back surface field formation. (Rohatgi, A., Sana, P., Ramanachalam, M. S., Salami, J., and Carter, W. B., Proc. 23rd IEEE PV Specialists Conf., pp. 52–57, 1993.) Phosphorus gettering is done by heavy phosphorus diffusion followed by etch removal of the diffused regions. Chlorine gettering results from a trichloroethane or dichloroethylene source during high temperature oxidation which may also enhance diffusion length. High flux solar furnace may be used to diffuse the phosphorus, aluminum, or chlorine gettering centers into silicon. Variation of the wavelength and intensity of the light flux may be used to optimize the gettering process.

EXAMPLE 3

A simple chemical etch was used to produce porous silicon on both sides of a metallurgical grade silicon wafer. Effective conversion of silicon into porous silicon is evidenced by the occurrence of photoluminescence. Porous silicon can be used to provide gettering sites for upgrading metallurgical grade silicon for photovoltaic solar cell applications. Metallurgical-grade polycrystalline silicon wafers were used as a starting material to produce photoluminescent porous silicon. Chemical etching (also known as stain etching) using a solution of 99% hydrofluoric acid and 1% nitric acid was used instead of the conventional electrochemical method of producing porous silicon. This etching method is very simple (no electrodes required) and fast (10 minutes or less) and produces porous silicon on both sides of the silicon wafer. No preferential etching of the grain boundaries of the polycrystalline silicon was observed. Photoluminescence measurements show that the porous silicon produced using metallurgical grade silicon has a relatively sharp emission width (indicating a narrow size distribution of the quantum wires) and a bandgap around 2.0 eV.

Figure 2:
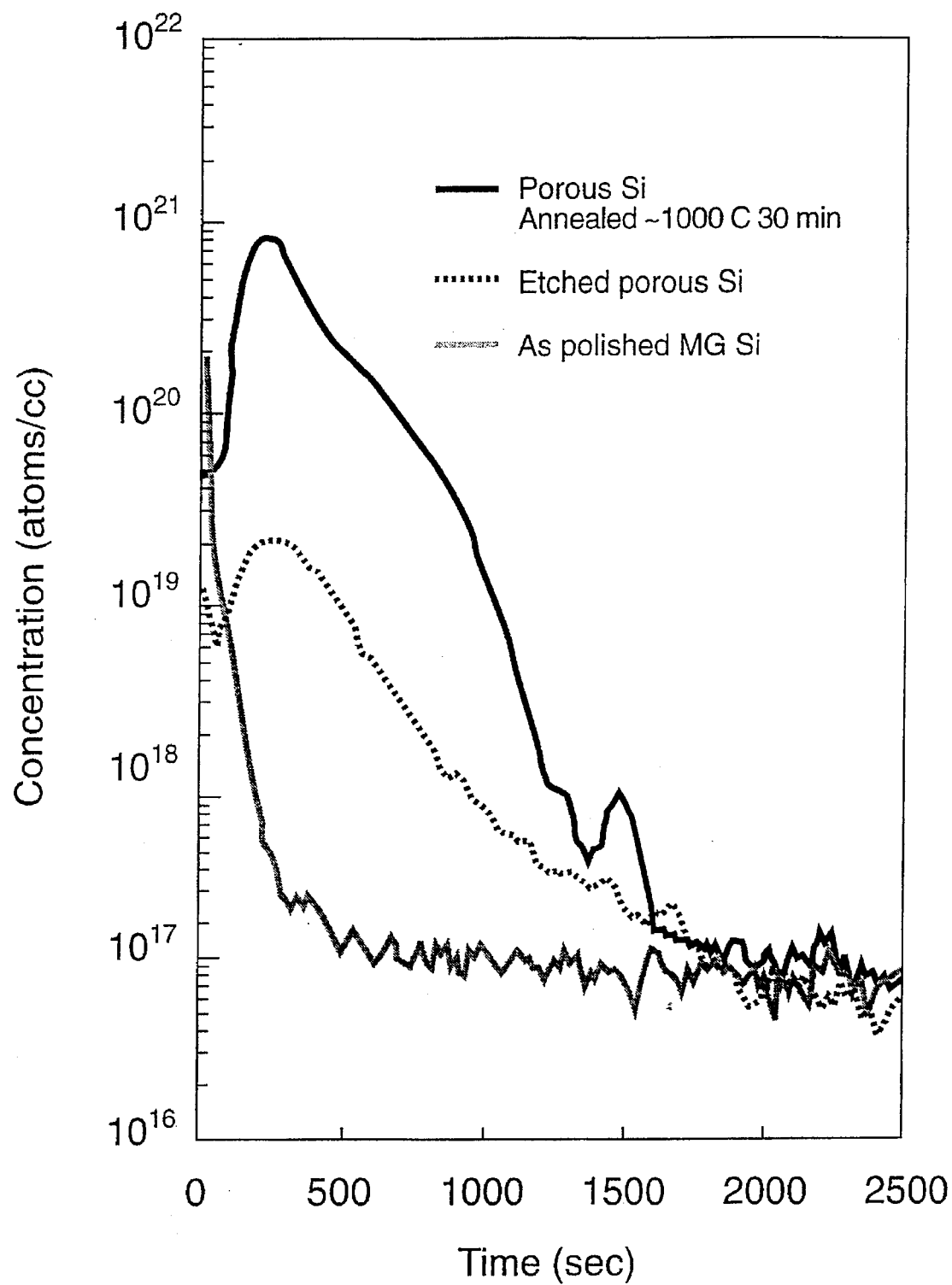
FIG. 2 shows a comparison of the copper impurity levels as a function of the sputtering time (which is proportional to the distance from the surface) for (1) an as-polished metallurgical grade silicon (mg-Si) wafer, (2) the same wafer after porous silicon etching, and (3) the same wafer after a 30 minute high flux solar furnace annealing treatment.

The porous silicon etched metallurgical grade silicon wafers were then processed in a high flux solar furnace for 15 to 30 minutes at a sample temperature of around 1000° C. The flux intensity is from about 300 to about 500 kW/m$^2$. Process times of from about 10 minutes to about 60 minutes are deemed effective, depending on the thickness of the porous silicon layer desired, and the temperature, which may vary from about 700° to about 1000° C. Secondary ion mass spectroscopy (SIMS) depth profiling measurements performed on both the front and back surfaces of the metallurgical grade silicon wafers showed that the high flux solar furnace treatments caused impurities in the bulk of the wafers to diffuse and segregate at the porous silicon etched surfaces. The effectiveness of this impurity gettering process increases with the high flux solar furnace treatment time. FIG. 2 shows a comparison of the copper impurity levels as a function of the sputtering time (which is proportional to the distance from the surface) for (1) an as-polished metallurgical grade silicon wafer, (2) the same wafer after porous silicon etching, and (3) the same wafer after a 30 minute high flux solar furnace processing treatment. The high copper concentration region near the surface of the wafer corresponds to the porous silicon etched region, which is about 2 microns thick. Layers of porous silicon having thicknesses of from about 1 to about 10 microns are expected to be effective getters for this purpose. These data clearly show that the combination of a porous silicon etch and a high flux solar furnace treatment is effective in gettering impurities to the porous silicon etched surface layers. These surface layers, along with the gettered impurities, can then be easily removed from the wafer by a wet chemical etch, or by mechanical grinding of the layers.

Texturing Texturing of the surface of a wafer is useful in the early process steps of solar cell fabrication by providing sites for impurities to aggregate for subsequent removal, as demonstrated in Example 3, above.

Texturing of the surface of a photovoltaic cell is also useful to reduce front surface reflection, thereby increasing the optical absorptivity of the material. This increase in optical absorptivity results in higher conversion efficiency of light to electricity.

Texturing can be performed with electrochemical or purely chemical means. Etching solutions are used to remove material from the surface region, leaving behind a sponge-like, porous layer on the surface. However, these procedures produce a toxic waste stream of acids and salts that are environmentally unfriendly. An alternate approach is hereby disclosed, whereby concentrated solar radiation is used to induce a photothermal reactive etch of the surface. This etch has the same result as the chemical etches, but the waste stream is significantly reduced.

The high flux solar furnace based etch of the present invention uses the following steps. A suitable substrate is housed in a container with a controlled atmosphere and a window to admit a beam of light. The controlled atmosphere contains one or more species of reactive gas used in the etching reaction and excludes unwanted species (e.g., oxygen). Reactive gases include any halogen-containing gas. Sunlight is directed through the window onto the target. The target heats up to a temperature where a photothermal reactive etch is initiated on the surface receiving the light. Etching continues until a porous layer of the desired thickness is obtained.

A high flux solar furnace can decompose fluorine-containing gases, such as $C_2F_6$, for texture etching of the silicon solar cell surface, which enhances light absorption. Surface texturing of a nitirde covered Si surface using solar radiation and $C_2H_6$ source gas has been demonstrated by Lewandowski and co-workers (Lewandowski, A., *Mat. Tech.*, Vol. 8, pp. 237–249, 1993). Selective texturing or grooving may be obtained by oxide protection of selected areas of the cell. A textured silicon surface also enhances the high flux solar furnace processing by trapping sunlight. Bare silicon surfaces reflect about 30% of the incident light. To increase the amount of light absorbed by the solar cell, antireflection (AR) coatings and/or surface texturing are needed. In conventional solar cells, texturing is achieved using laser scribing, plasma etching, mechanical scribing, or anisotropic chemical etching.

EXAMPLE 4

In an example of the high flux solar furnace etch, a wafer of n-type Si (100) was solvent cleaned and mounted in a vacuum chamber fitted with a fused silica window. The vacuum chamber was pumped and purged repetitively with argon to remove air and provide an inert background. A reactive gas, in this case, hexaflouroethane was admitted into the system at a rate of 50 sccm, while the pressure was held at 1 torr. The solar beam was applied to the front surface of the wafer so that a heating rate of 100° C. per minute was maintained up to the reaction temperature of 775° C. (applied flux of 373 kW/m$^2$). Etching was allowed to continue for 9 minutes, then it was terminated by removing the solar beam. The resultant surface texture was a porous layer 1 μm thick, with typical filament sizes in the range of 0.05 μm. Surface texturing occurred only on the surface of the wafer exposed to the solar beam.

Hydrogen passivation Hydrogen passivation of defects in Si has been shown to be effective in improving solar cell efficiencies (Tsuo, Y. S. and Milstein, J. B., *Journal of Applied Physics* Vol. 57, p. 5523, 1985). Hydrogen atoms can be introduced into silicon by low-energy ion implantation, radio-frequency plasma hydrogenation, or thermally induced diffusion from a hydrogen source in contact with the silicon wafer surface. Ion-beam and radio-frequency plasma processing require an additional step of vacuum processing. In addition, they tend to cause surface damage of the solar cell. The small improvement obtained by these passivation methods is usually not worth the added cost. The method of hydrogenation by plasma-deposited silicon nitride capping may be a less damaging and more cost effective method. This method requires an additional heating step to diffuse hydrogen into the silicon substrate. The solar furnace can easily and efficiently perform the necessary heating step for hydrogen passivation.

Further efficiency improvements of high-flux solar furnace processed cells can be obtained by using (1) photolithography lift-off process to reduce the front metal coverage, (2) two-step diffused front junction, (3) front and back surface passivation layers, and (4) front surface texturing. Table 4 shows the improvements realized by adding some of these improvements to control cells. Assuming the same ratio of improvement is obtained as with the conventional cells, a conversion efficiency of over 21% should be possible for high flux solar furnace-processed cells.

TABLE 4

Cell Efficiency Improvements By Additional Cell Processing.

| Cell # | Structure | Voc (V) | Jsc (mA/cm2) | FF (%) | AM 1.5 η (%) |
|---|---|---|---|---|---|
| TF6-control, conventional processing | 1-step POCl$_3$ diffusion, BSF, shadow-mask-evaporated contacts, no SiO$_2$, no AR coating | 0.570 | 20.1 | 67.1 | 7.68 |
| TF3-control, conventional processing | 1-step POCl$_3$ diffusion, BSF, lift-off Ti/Pd/Ag, SiO$_2$ passivation, no AR coating | 0.605 | 22.5 | 73.9 | 10.1 |
| TF4-control, conventional processing | 2-step POCl$_3$ diffusion, BSF, lift-off Ti/Pd/Ag, SiO$_2$ passivation, no AR coating | 0.628 | 25.1 | 78.8 | 12.4 |

Although this invention has been described with respect to specific embodiments, it is not intended to be limited thereto, and various modifications which will be apparent to those skilled in the art are deemed to fall within the spirit and scope of the present invention.

I claim:

1. A method of forming a front-surface junction and back-surface field, comprising:
   providing a semiconductor substrate containing a dopant and having a front surface and a back surface;
   depositing a dopant source layer on said front surface of the substrate, said dopant source layer being of opposite doping type than the dopant of the substrate;
   depositing a second dopant source layer on said back surface of the substrate, said second dopant source layer being of the same doping type as the dopant of the substrate;
   exposing the substrate to concentrated solar radiation.

2. A method according to claim 1, wherein the thickness of said dopant source layer on said front surface is from about 0.1 to 1 micrometer.

3. A method according to claim 1, wherein the thickness of said second dopant source layer on said back surface is from about 0.1 to 1 micrometer.

4. A method according to claim 1, wherein the substrate is exposed to concentrated solar radiation for a period of about 3 to about 20 minutes.

5. A method according to claim 1, wherein the solar radiation is concentrated to an intensity of about 150 to about 500 kW/m$^2$.

6. A method of making a silicon solar cell, comprising:
   providing a silicon substrate containing a dopant and having a front surface and a back surface;
   depositing a dopant source layer on said front surface of the substrate, said dopant being of opposite doping type than the dopant of the substrate;
   depositing a second dopant source layer on said back surface of the substrate, said second dopant source layer being of the same doping type as the dopant of the substrate;
   exposing the substrate to concentrated solar radiation; and
   forming a transparent or translucent electrical conducting layer on said front surface of the substrate.

7. A method according to claim 6, wherein the thickness of said dopant source layer on said front surface is from about 0.1 to 1 micrometer.

8. A method according to claim 6, wherein the thickness of said second dopant source layer on said back surface is from about 0.1 to 1 micrometer.

9. A method according to claim 6, wherein the substrate is exposed to concentrated solar radiation for about 3 to about 20 minutes.

10. A method according to claim 6, wherein the solar radiation is concentrated to an intensity of about 150 to about 500 kW/m$^2$.

11. A method of making multicrystalline silicon thin films from amorphous silicon, comprising the steps of:

provifing a substrate;

forming a layer of amorphous silicon on the substrate; and exposing the substrate to concentrated solar radiation.

12. A method according to claim 11, wherein the substrate is exposed to concentrated solar radiation for about 1 to about 30 seconds.

13. A method according to claim 11, wherein the layer of amorphous silicon is from about 0.1 to about 20 micrometers thick.

14. A method according to claim 11, wherein the solar radiation is concentrated to an intensity of about 1,000 to about 3,000 kW/m$^2$.

15. A method of removing impurities from a silicon wafer, comprising the following steps carried out in the order given;

forming a layer of porous silicon on said silicon wafer;

exposing the wafer to concentrated solar radiation; and removing said layer of porous silicon.

16. A method according to claim 15, wherein the porous silicon layer has a thickness of about from 1 to about 10 μm.

17. A method according to claim 15, wherein the wafer is exposed to concentrated solar radiation for about 10 to about 60 minutes.

18. A method according to claim 15, wherein the solar radiation is concentrated to an intensity of about 300 to about 500 kW/m$^2$.

19. A method of forming a textured layer on the surface of a semiconductor substrate, comprising:

exposing the substrate to concentrated solar radiation in the presence of a reactive gas.

* * * * *